US011888286B2

(12) United States Patent
He et al.

(10) Patent No.: US 11,888,286 B2
(45) Date of Patent: Jan. 30, 2024

(54) LASER CHIP FOR FLIP-CHIP BONDING ON SILICON PHOTONICS CHIPS

(71) Applicant: INPHI CORPORATION, San Jose, CA (US)

(72) Inventors: Xiaoguang He, San Jose, CA (US); Radhakrishnan L. Nagarajan, San Jose, CA (US)

(73) Assignee: MARVELL ASIA PTE LTD, Singapore (SG)

( * ) Notice: Subject to any disclaimer, the term of this patent is extended or adjusted under 35 U.S.C. 154(b) by 464 days.

(21) Appl. No.: 17/076,162

(22) Filed: Oct. 21, 2020

(65) Prior Publication Data

US 2022/0123518 A1 Apr. 21, 2022

(51) Int. Cl.
*H01S 5/02* (2006.01)
*H01S 5/0238* (2021.01)
*H01S 5/028* (2006.01)
*H01S 5/0237* (2021.01)
*H01S 5/227* (2006.01)
*H01S 5/22* (2006.01)
*H01S 5/0234* (2021.01)

(52) U.S. Cl.
CPC .......... *H01S 5/0238* (2021.01); *H01S 5/0202* (2013.01); *H01S 5/0234* (2021.01); *H01S 5/0237* (2021.01); *H01S 5/0287* (2013.01); *H01S 5/2206* (2013.01); *H01S 5/2275* (2013.01)

(58) Field of Classification Search
CPC .. H01S 5/0234; H01S 5/0237; H01S 5/02375; H01S 5/021
See application file for complete search history.

(56) References Cited

U.S. PATENT DOCUMENTS

| 10,951,003 | B1* | 3/2021 | He | H01S 5/323 |
| 2002/0037025 | A1* | 3/2002 | Bartman | H01S 5/141 |
| | | | | 372/36 |
| 2017/0003463 | A1* | 1/2017 | Nadeau | H01S 5/0237 |
| 2018/0342851 | A1* | 11/2018 | Hemenway | G02B 6/42 |

* cited by examiner

*Primary Examiner* — Xinning(Tom) Niu
*Assistant Examiner* — Delma R Fordé

(57) ABSTRACT

A laser chip for flip-chip bonding on a silicon photonics chip with passive alignment features. The laser chip includes a chip body made of a p-region and a n-region in vertical direction and extended from a front facet to a rear facet in longitudinal direction, a pair of first vertical stoppers formed respectively beyond two sides of the chip body based on a wider width of the n-region, an active region buried in the chip body between the p-region and the n-region in the vertical direction and extended from the front facet to the rear facet in the longitudinal direction, an alignment mark formed on a top surface of the p-region near the front facet with a lateral distance defined in sub-micron precision relative to the active region; and a thin metal film on the surface of the p-region having a cleaved edge shared with the front facet.

15 Claims, 7 Drawing Sheets

Side View

Wafer for making laser chips

Top view

LASER CHIP FOR FLIP-CHIP BONDING ON SILICON PHOTONICS CHIPS

BACKGROUND OF THE INVENTION

The present invention relates to optical telecommunication techniques. More particularly, the present invention provides a laser chip and a method for flip-chip bonding on a silicon photonics chip with enhanced passive alignment.

Over the last few decades, the use of communication networks exploded. In the early days Internet, popular applications were limited to emails, bulletin board, and mostly informational and text-based web page surfing, and the amount of data transferred was usually relatively small. Today, Internet and mobile applications demand a huge amount of bandwidth for transferring photo, video, music, and other multimedia files. For example, a social network like Facebook processes more than 500 TB of data daily. With such high demands on data and data transfer, existing data communication systems need to be improved to address these needs.

40-Gbit/s and then 100-Gbit/s data rates wide-band DWDM (Dense Wavelength Division Multiplexed) optical transmission over existing single-mode fiber is a target for the next generation of fiber-optic communication networks. More recently, optical components are being integrated on silicon substrates for fabricating large-scale photonic integrated circuits that co-exist with micro-electronic chips. A whole range of photonic components, including filters, (de) multiplexers, splitters, modulators, and photodetectors, have been demonstrated, mostly in the silicon-photonics platform. The silicon-photonics platform on silicon-on-insulator substrate is especially suited for standard WDM communication bands at 1300 nm and 1550 nm, as silicon (n=3.48) and its oxide $SiO_2$ (n=1.44) are both transparent, and form high-index contrast, high-confinement waveguides ideally suited for medium to high-integration silicon photonics integrated circuits (SPICs).

Semiconductor laser in silicon photonics platform have been implemented for many applications of optical telecommunication. In some applications, the laser chip is applied by flip-chip bonding to a silicon photonics for wide-band high-speed optical communication with increasing spectral efficiency. However, technical challenges exist for achieving excellent and reliable passive alignment in vertical, longitudinal, and lateral directions. Therefore, improved techniques are desired.

BRIEF SUMMARY OF THE INVENTION

The present invention relates to optical telecommunication techniques. More particularly, the present invention provides a laser chip and a method for flip-chip bonding on a silicon photonics chip with enhanced 3D passive alignment. More particularly, the present invention provides a laser chip configured to have sub-micron precision in 3D passive alignment between laser and waveguide in silicon photonics chip with <3 dB optical loss having a doubled vertical alignment tolerance window for various high-speed data communication applications, though other applications are possible.

In an embodiment, the present invention provides a laser chip for flip-chip bonding on a silicon photonics chip with 3D passive alignment features. The laser chip includes a chip body made of a p-region and a n-region in vertical direction and extended from a front facet to a rear facet in longitudinal direction. The laser chip further includes a pair of first vertical stoppers formed respectively beyond two sides of the chip body based on a wider width of the n-region. Additionally, the laser chip includes an active region in a linear shape buried in the chip body between the p-region and the n-region in the vertical direction and extended from the front facet to the rear facet in the longitudinal direction. Furthermore, the laser chip includes a first alignment mark in the longitudinal direction formed on a top surface of the p-region near the front facet with a lateral distance defined in sub-micron precision relative to a vertical projection line of the active region in the top surface of the p-region. Moreover, the laser chip includes a thin metal film on the surface of the p-region having a cleaved edge shared with the front facet.

In an alternative embodiment, the present invention provides a method for bonding a laser chip on a silicon photonics chip with enhanced 3D alignment precision and tolerance. The method includes a process of providing a laser chip including forming a chip body with an active region buried between a p-region and a n-region in vertical direction and extended from a front facet to a rear facet in longitudinal direction, forming a pair of first vertical stoppers located beyond respective two sides of the chip body, forming a first alignment mark in the longitudinal direction in a top surface of the p-region near the front facet defined with a lateral distance in sub-micron precision relative to a vertical projection line of the active region in the top surface of the p-region, and forming a thin metal film having a cleaved edge matching with the front facet. The method further includes a step of setting up a chip-site in a recessed surface of the silicon photonics chip having a waveguide port located at a height above the recessed surface. The chip-site includes a pair of second vertical stoppers stood on the recessed surface and a second alignment mark in the recessed surface with a lateral distance defined in sub-micron precision relative to a vertical projection line of the waveguide port in the recessed surface. Additionally, the method includes a step of bonding the laser chip with the top surface of the p-region facing down via a solder material to the chip-site in the recessed surface with the pair of first vertical stoppers respectively joining with the pair of second vertical stoppers for determining vertical alignment between the active region and the waveguide port. Furthermore, the method includes a step of determining lateral alignment by aligning the first alignment mark to the second alignment mark. Moreover, the method includes a step of determining longitudinal alignment by identifying the front facet based on reflection contrast at the cleaved edge of the thin metal film.

In another alternative embodiment, the present invention provides a laser chip for flip-chip bonding on a silicon photonics chip with enhanced passive alignment features. The laser chip includes a chip body made of a p-region and a n-region in vertical direction and extended from a front facet to a rear facet in longitudinal direction. Additionally, the laser chip includes a pair of first vertical stoppers formed respectively beyond two sides of the chip body. Furthermore, the laser chip includes an active region in a linear shape buried in the chip body between the p-region and the n-region in the vertical direction and extended from the front facet to the rear facet in the longitudinal direction. Moreover, the laser chip includes a first alignment mark in the longitudinal direction formed on a top surface of the p-region near the front facet with a lateral distance defined in sub-micron precision relative to a vertical projection line of the active region in the top surface of the p-region.

In yet another alternative embodiment, the present invention provides A laser chip for flip-chip bonding on a silicon photonics chip with enhanced passive alignment features. The laser chip includes a chip body made of a p-region and a n-region in vertical direction and extended from a front facet to a rear facet in longitudinal direction. Additionally, the laser chip includes an active region in a linear shape buried in the chip body between the p-region and the n-region in the vertical direction and extended from the front facet to the rear facet in the longitudinal direction. Furthermore, the laser chip includes a first alignment mark in the longitudinal direction formed on a top surface of the p-region near the front facet with a lateral distance defined in sub-micron precision relative to a vertical projection line of the active region in the top surface of the p-region. Moreover, the laser chip includes a thin metal film on the surface of the p-region having a cleaved edge shared with the front facet.

The present invention achieves these benefits and others in the context of known technology of semiconductor laser associated with silicon photonics platform. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

Figure 1A:
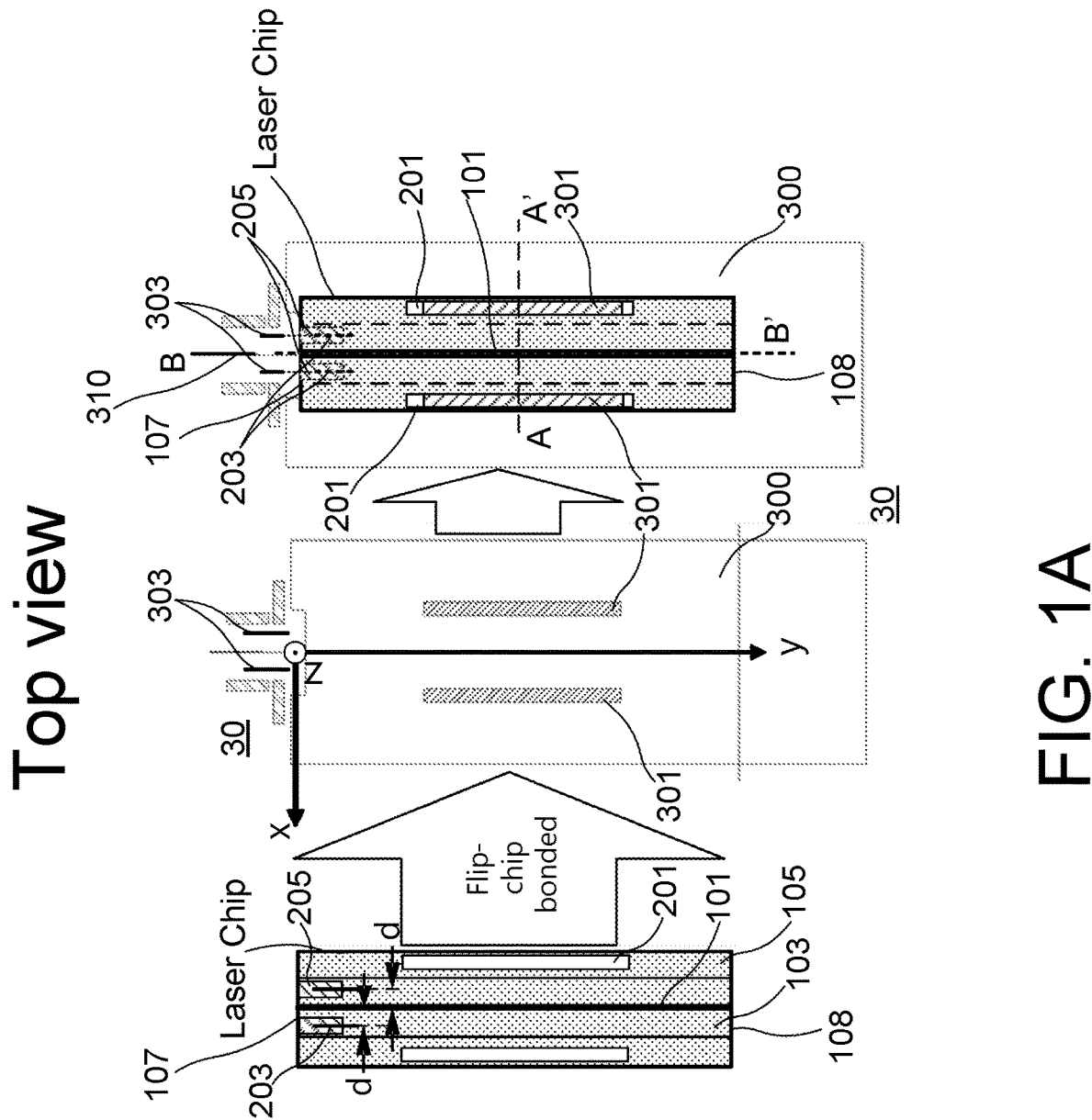
FIG. 1A is a top view diagram of a laser flip-chip with 3D alignment features bonding on a chip-site of a silicon photonics chip according to an embodiment of the present invention.

The present invention relates to optical telecommunication techniques. More particularly, the present invention provides a laser chip and a method for flip-chip bonding on a silicon photonics chip with enhanced 3D passive alignment. More particularly, the present invention provides a laser chip configured to have sub-micron precision in 3D passive alignment between laser and waveguide in silicon photonics chip with <3 dB optical loss having a doubled vertical alignment tolerance window for various high-speed data communication applications, though other applications are possible.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels inner, outer, left, right, front, rear, top, bottom, end, side, forward, reverse, vertical, longitudinal, lateral, recessed, ridge, valley, clockwise and counter clockwise have been used for convenience purposes only and are not intended to imply any particular fixed direction. Instead, they are used to reflect relative locations and/or directions between various portions of an object.

Figure 1B:
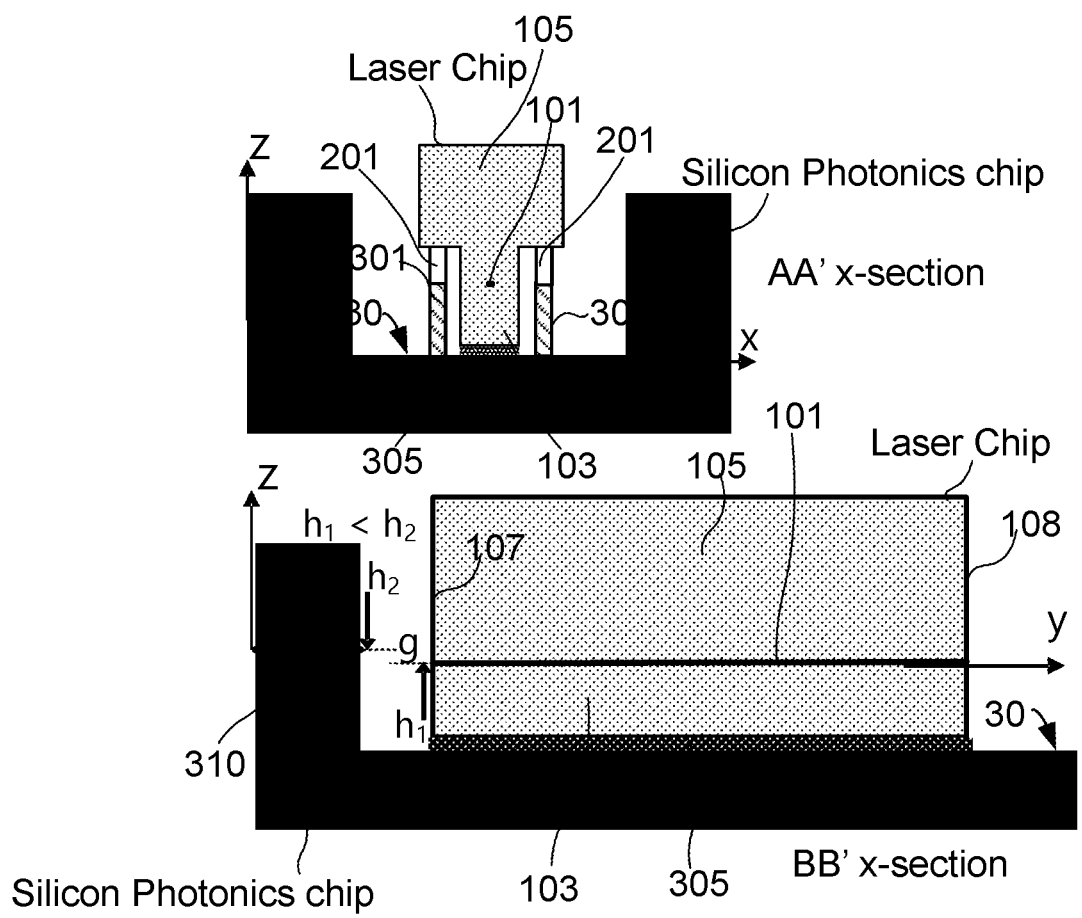
FIG. 1B is a side view diagram of the laser flip-chip with 3D alignment features bonding on the chip-site in a recessed surface of the silicon photonics chip according to the embodiment of the present invention.

In an aspect, the present disclosure provides a semiconductor laser chip for flip-chip bonding to silicon photonics chip with enhanced 3D passive alignment. In an example, the laser may be configured for semiconductor optical amplifier high-power operability applied in a wide-band wavelength tunable laser in silicon photonics platform. FIG. 1A is a top view and FIG. 1B is a side view diagram of a laser flip-chip with 3D alignment features bonding on a chip-site in a recessed surface of a silicon photonics chip according to an embodiment of the present invention. This diagram is merely an example, which should not unduly limit the scope of the claims. One of ordinary skill in the art would recognize many variations, alternatives, and modifications. As shown, in a top view diagram, a laser chip with p-region 103 facing up and n-region 105 down is shown to the left of the figure. The laser chip includes an active region 101 (which actually should be located beneath the p-region 103 and not directly visible in the top view) located between the p-region 103 and the n-region 105 and extended in longitudinal direction (y-direction) from a front facet 107 to a rear facet 108. Optionally, the n-region 105 has a wider width than the p-region 103. A pair of first vertical stoppers 201 is formed beyond two opposite sides of the p-region 103 based on the wider width of the n-region 105. Optionally, the first vertical stopper 201 has an elongated shape along the y-direction. The laser chip, in this top view diagram, also includes one or two alignment marks 203 on a top surface of the p-region 103. Each alignment mark 203 is a section of linear feature along the longitudinal (y) direction near the front facet 107, respectively located at a lateral distance d from a projected line of the active region 101 at the top surface of the p-region 103. Optionally, two alignment marks are formed symmetrically at two sides with an equal distance d relative to the projected line of the active region 101 at the top surface of the p-region 103. Optionally, the distance d can be controlled with sub-micron precision by using photolithography masking and performing regrowth process of the laser confinement/clad layer around the laser active region 101. Additionally, a thin metal film 205 is formed with an edge sharing with the front facet 107, which is configured to identify the position of the front facet of the laser under microscope for facilitating alignment in longitudinal (y) direction.

Referring to FIG. 1, in the top view diagram, the laser chip is designed to flip-chip bond to a chip-site 300 preset-up on a surface 30 of a silicon photonics chip. The chip-site 300, as shown in the middle of the top view diagram, includes at least a pair of second vertical stoppers 301 standing on the surface 30 of the silicon photonics chip with an elongated shape along the y-direction and a lateral spacing substantially equal to that for the pair of first vertical stoppers 201. The chip-site 300 is also formed with two alignment marks 303 inscribed in the surface of the surface 30 of the silicon photonics chip, which is designed for aligning with the alignment marks 203 on the laser chip in lateral (x) direction with sub-micron precision.

Referring to FIG. 1A again, in the top view diagram to the right part, the laser chip is flip-bonded onto the chip-site 300 in the surface 30 of the silicon photonics chip. In the flip-chip bonding position, the pair of first vertical stoppers 201 on the laser chip is rested on or joined with the pair of second vertical stoppers on the surface 30 as both the pair of first vertical stoppers 201 and the pair of second vertical stoppers 301 have substantially equal lateral spacing. As it will be shown later, each of first vertical stopper and second vertical stopper has a specific height design to make the active region 101 of the laser chip to align in vertical (z) direction with a waveguide in the silicon photonics chip with desired <3 dB optical coupling loss in a relative large vertical distance tolerance window. The alignment marks 203 of the laser chip are used to align with the align with the alignment marks 303 on the surface 30 of the silicon photonics chip so that the active region 101 of the laser chip can be aligned with the waveguide in lateral (x) direction with sub-micron precision to support achievement of <3 dB coupling loss for laser light passing from the active region into the waveguide. The thin metal film 205 can be used to generate good contrast for optical reflection for identifying the position of the front facet 107, which is a critical reference point for alignment in longitudinal y-direction to support achievement of <3 dB coupling loss for laser light passing from the active region into the waveguide.

Referring to FIG. 1B, the upper portion side view diagram shows a cross-section view along AA' plane (along x-direction) of the laser chip flip-bonding on a recessed surface 30 of the silicon photonics chip. As shown, the p-region 103 is turned to face down and bond via a solder material 305 with (chip-site 300 on) the recessed surface 30 of the silicon photonics chip. At the same time, the pair of first vertical stoppers 201 is approached to join with the pair of second vertical stoppers 301, which determines vertical position of the active region 101 while the surface of p-region can flexibly pushing away extra solder material 305 to settle with remaining portion of solder material 305 on top of the recessed surface 30.

The lower portion of the side view diagram shows a cross-section view along BB' plane (along y-direction) of the laser chip flip-bonding via the solder material 305 on the recessed surface 30 of the silicon photonics chip with the active region 101 in a substantially linear shape laid between a p-region 103 (at bottom) and a n-region 105 (on top). Optionally, the active region 101, as the p-region settles on the recessed surface 30 via the solder material 305, is disposed at a height $h_1$ above the recessed surface 30. As it is formed in the silicon photonics chip, an optical waveguide 310 is laid horizontally along the y-direction with a receiving port at a side wall associated with the recessed surface 30 which is facing the front facet 107 of the laser flip-chip. Optionally, the optical waveguide 310 including the port at the side wall is designed to have a height $h_2$ above the recessed surface 30. An ideal optical alignment with a maximum coupling efficiency between the linear active region 101 and the optical waveguide 310 requires a perfect vertical alignment to give $h_1=h_2$ or a vertical misalignment $g=h_1-h_2=0$, as shown in FIG. 2.

Figure 2:
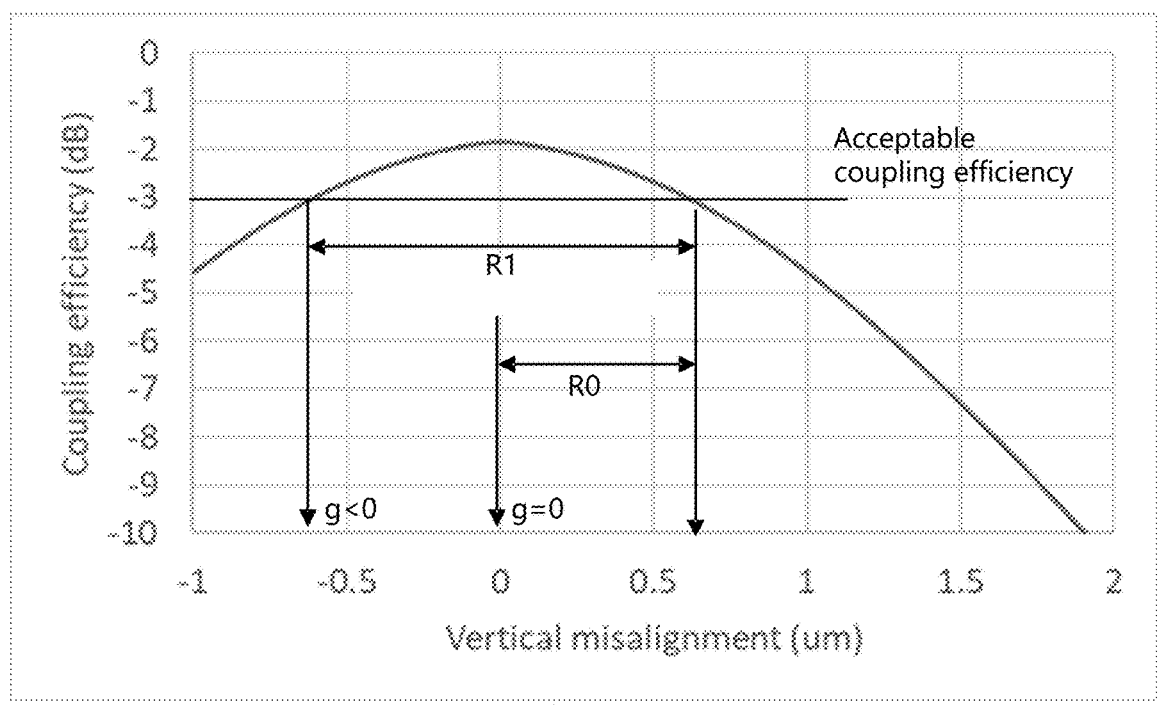
FIG. 2 is a plot of optical coupling efficiency versus vertical misalignment for the laser flip-chip bonding on silicon photonics chip according to an embodiment of the present invention.

Referring to FIG. 2, the maximum coupling efficiency corresponding to the perfect vertical alignment may be associated with a coupling loss of about −2 dB. For laser flip-chip bonding, the vertical alignment position of the active region of the laser relative to the waveguide port in the silicon photonics chip is determined mainly by relative positions of the pair of first vertical stoppers relative to the active region in the laser chip and the pair of second vertical stoppers relative to the optical waveguide in the silicon photonics chip. When aligning the active region 101 perfectly with the vertical misalignment g=0 to the port of optical waveguide 310 at the side wall, it potentially gives the maximum coupling efficiency. But, in reality there may always be some debris formed to the stop plane of the second (or first) vertical stopper so that when they are joined together the laser chip as well as the active region 101 is physically forced to be placed at a higher position. This makes the coupling efficiency between the active region and the optical waveguide 310 to fall into the range of R0, given the worst acceptable coupling efficiency to be −3 dB. R0, therefore, becomes the vertical alignment tolerance range. Optionally, the tolerance range R0 is from 0 to about 0.5~0.7 μm.

In an embodiment of the present invention, the vertical alignment design of the laser chip is to adjust a vertical height of a stop plane of the pair of first vertical stoppers 201 in the laser chip relative to the active region 101 during the formation process of the laser chip, based on a vertical height of a stop plane of the second vertical stopper 301 relative to the optical waveguide 310 above the recessed surface 30 in a corresponding silicon photonics chip for the laser chip to be bonded. The stop plane referred here is an end plane of the vertical stopper. The vertical height of the first vertical stopper 201 is the height of the corresponding stop plane relative to its base at the n-region 105 with a wider width vs. n-region 103. The vertical height of the second vertical stopper 301 is the height of the corresponding stop plane relative to its base at the recessed surface 30. The target of the vertical alignment design is to intentionally set the vertical misalignment g<0 at about −0.5 μm~−0.7 μm below the optical waveguide 310. In this embodiment, as shown in FIG. 2, for the same acceptable coupling efficiency of −3 dB between the active region 101 and the optical waveguide 310, the vertical alignment tolerance range R1 is nearly doubled in window size, from −0.5~−0.7 μm to +0.5~0.7 μm.

In another aspect, the present invention provides a method of forming a laser chip set for flip-chip bonding to a silicon photonics chip with 3D passive optical alignment in sub-micron precision. FIG. 1 shows the features of using vertical stoppers for controlling/adjusting vertical alignment tolerance in sub-micron precision as well as the features of alignment marks on top surface of p-region of the laser chip for achieving lateral alignment in the chip-site of the silicon photonics chip. FIG. 3 is a schematic diagram showing a method of forming a lateral alignment mark for the laser chip (A) before regrowth and (B) after regrowth of a clad layer of the laser diode according to an embodiment of the present invention. This diagram is merely an example, which should not unduly limit the scope of the claims. One of ordinary skill in the art would recognize many variations, alternatives, and modifications.

Figure 3A:
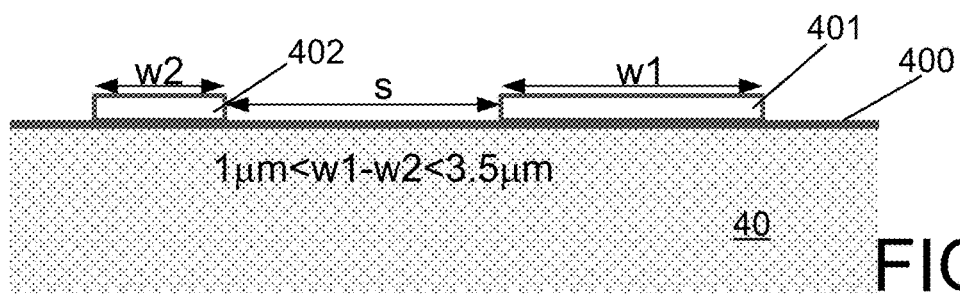
FIG. 3A is a schematic diagram showing a method of forming a lateral alignment mark for the laser chip before regrowth of a clad layer of the laser diode according to an embodiment of the present invention.

In an embodiment, FIG. 3A shows a schematic diagram in a middle of a formation process of the laser chip. As shown, an active layer 400 has formed over a confinement/clad layer 40. Depending on working wavelength spectrum, the active layer 400 includes different semiconductor materials including one or more compound semiconductors or a combination of InAsP, GaInNAs, GaInAsP, GaInAs, and AlGaInAs configured as a multi-quantum-well structure. The confinement/clad layer 40 typically includes InP-based semiconductor material with various doping profiles and different energy gaps comparing to that for the active layer 400. Optionally, the confinement/clad layer 40 is doped with n-type impurity to be configured as the n-region 105 (of the laser chip, see FIG. 1).

Figure 6A:
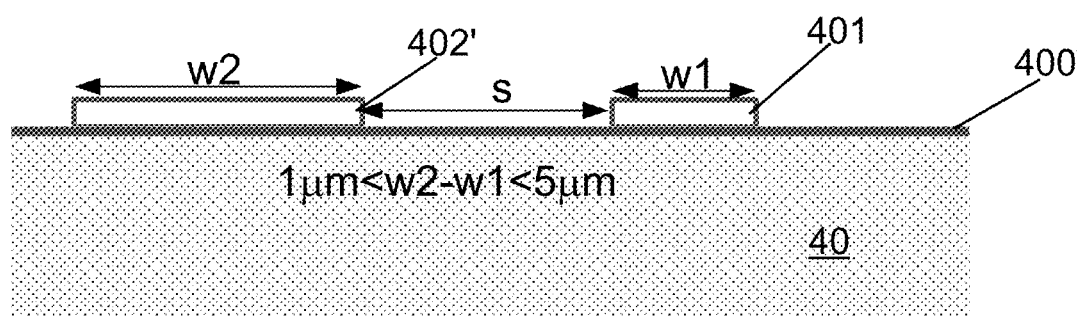
FIG. 6A is a schematic diagram showing a method of forming a lateral alignment mark for the laser chip before regrowth of a clad layer of the laser diode according to another embodiment of the present invention.

Referring to FIG. 3A, the method of forming a laser chip set for flip-chip bonding to a silicon photonics chip with 3D passive optical alignment includes placing a first oxide mask 401 of a first width w1 over the active layer 400 where the active region 101 (FIG. 1) is to be formed and a second oxide mask 402 of a second width w2 over the active layer 400 where a first alignment mark is to be formed. FIG. 3A is a cross-sectional view showing the second oxide mask 402 of width w2 formed at a lateral distance s away from the first oxide mask 401 of width w1. This can be done using matured techniques of masking and photolithography to achieve sub-micron precision for setting the dimensions of w1, w2, and s. Optionally, the first width w1 is set to about 1.5 μm~3.5 μm. Optionally, the second width w2 is set to be about 0.1 μm~2 μm, or 1~3.5 μm smaller than the first width w1, as shown in FIG. 3A. Optionally, the second width w2 is set to be about 2.5 μm~8.5 μm or 1~5 μm larger than the first width w1, as shown in FIG. 6A in another embodiment. Optionally, the first width w1 and the second width w2 are configured to have a difference between 1 μm and 5 μm at their lateral positions in sub-micron precision. Optionally, a third oxide mask similar to the second oxide mask can be formed at an opposite side of the first oxide mask with an equal spacing d, intending for forming a symmetric first alignment mark.

Figure 3B:
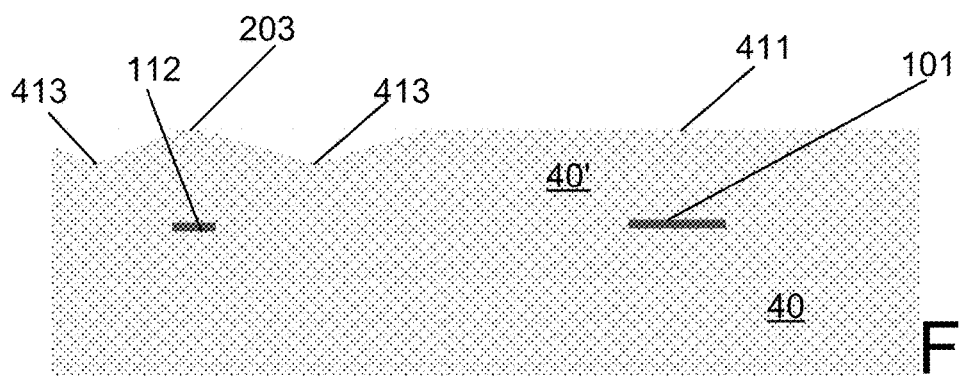
FIG. 3B is a schematic diagram showing a method of forming a lateral alignment mark for the laser chip after regrowth of the clad layer of the laser diode according to the embodiment of the present invention.

Referring to FIG. 3B, the method of forming a laser chip set for flip-chip bonding to a silicon photonics chip with 3D passive optical alignment includes performing a regrowth process applied to the structure shown in FIG. 3A to form the alignment mark 203 on a top surface of the regrowth of a p-region of the laser chip. FIG. 3B shows a cross-sectional view of a finished p-region formed by the regrowth of a p-type confinement/clad layer 40' with masks removed while leaving an active region 101 under the first oxide mask and a narrower section 112 of the active layer (400) under the second oxide mask (402) between the p-type confinement/clad layer 40' and the n-type confinement/clad layer 40. Note, though not shown in this cross-sectional view, the active region 101 has a long length extended in longitudinal y-direction (perpendicular to the cross-section plane) from a front facet to a rear facet of the laser chip while the narrower section 112 has just a short length in the longitudinal y-direction. In particular, the top surface of the finished p-region includes a profile having a relatively flatten region 411 over the previously placed first oxide mask led to a formation of the active region 101 due to more uniformed growth rate of the p-type confinement/clad layer 40' nearby and also includes a shallow-bunker region 413 near a small peak/ridge-like bump region 203 with the short length over the previously placed second oxide mask led to a formation of the narrower section 112 of the active layer due to slower growth rate of the p-type confinement/clad layer 40' nearby.

Figure 4:
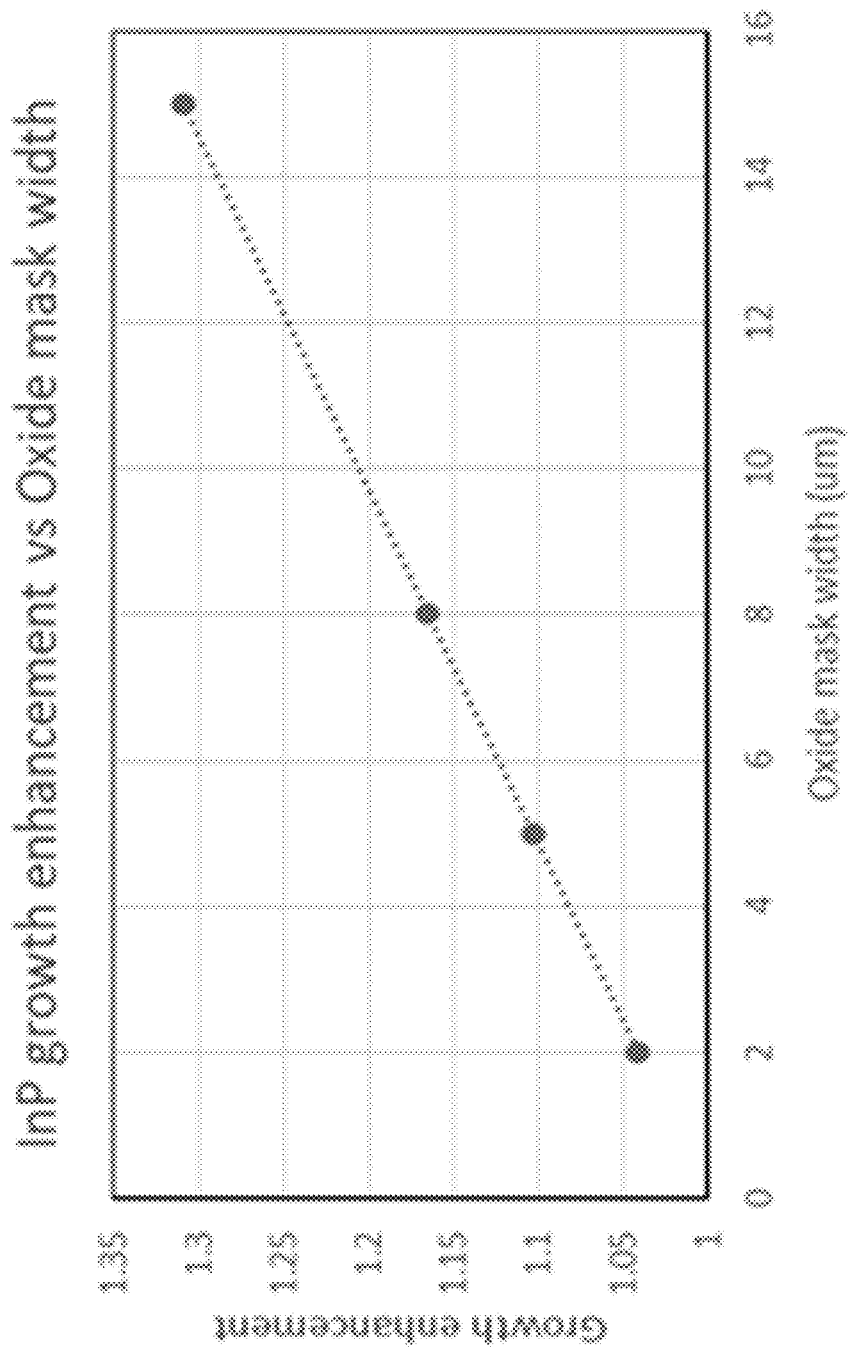
FIG. 4 is a plot of InP growth rate versus oxide mask width over an active layer for forming alignment mark after regrowth of a clad layer according to an embodiment of the present invention.

FIG. 4 is a plot of InP growth rate versus oxide mask width over an active layer for forming alignment mark after regrowth of a clad layer according to an embodiment of the present invention. As shown, the growth of the clad layer under the regrowth process associated with different oxide masks shows an interesting effect: the growth enhancement of InP-based clad layer in the regrowth process is nearly linearly dependent on oxide mask width. This effect causes the growth rate of the InP-based material in the region associated with the second oxide mask of the second width w2 is smaller relative to that in the region associated with the first oxide mask of the first width w1>w2 (see FIG. 3A) during the regrowth process after the masks are removed. Therefore, as the regrowth process proceeds, the shallow-bunker region 413 is formed and effectively causes the ridge-like bump region 203 of the short length to be formed (FIG. 3B) which is located substantially vertically on top of the location of the previously placed second oxide mask 402 (and now is indicated by the narrower section of active layer 112 left in the middle of the clad layer). Optionally, a second one ridge-like bump region can be formed based on the third oxide mask at the other side with equal spacing d relative to the active region.

Figure 6B:
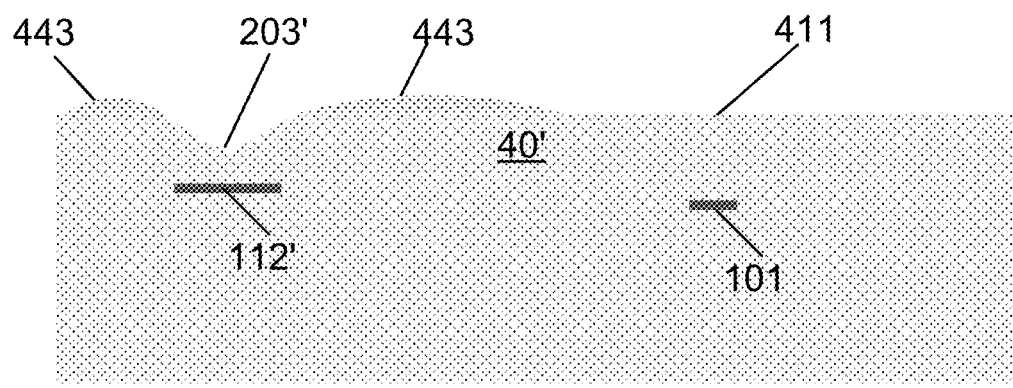
FIG. 6B is a schematic diagram showing a method of forming a lateral alignment mark for the laser chip after regrowth of the clad layer of the laser diode according to the another embodiment of the present invention.

In another embodiment shown in FIG. 6A, the second width w2 of the second mask 402 can be made to be greater than the first width w1 of the first oxide mask 401. Optionally, the first width w1 and the second width w2 are configured to have a difference between 1 µm and 5 µm at their lateral positions with a separation of s in sub-micron precision. Optionally, the first width w1 is set to about 1.5 µm~3.5 µm. the second width w2 is set to be about 2.5 µm~8.5 µm. The growth enhancement effect shown in FIG. 4 still works the same way so that the growth enhancement of InP-based clad layer in the regrowth process is nearly linearly dependent on oxide mask width. The growth rate of the clad layer around the region near the second oxide mask will be greater than that around the region near the first oxide mask. As a regrowth process is applied to the structure shown in FIG. 6A, the regrowth process with different growth rate in for different oxide mask width leads to a formation of an alignment mark 203' (FIG. 6B) on a top surface of the regrowth of a p-region of the laser chip. FIG. 6B shows a cross-sectional view of a finished p-region formed by the regrowth of a p-type confinement/clad layer 40' with masks removed while leaving an active region 101 under the first oxide mask and a wider section 112' of the active layer (400) under the second oxide mask (402') between the p-type confinement/clad layer 40' and the n-type confinement/clad layer 40. Note, though not shown in this cross-sectional view, the active region 101 has a long length extended in longitudinal y-direction (perpendicular to the cross-section plane) from a front facet to a rear facet of the laser chip while the shorter section 112 has just a short length in the longitudinal y-direction. The top surface of the finished p-region in FIG. 6B includes a profile having a relatively flatten region 411 over the previously placed first oxide mask led to a formation of the active region 101 due to more uniformed growth rate of the p-type confinement/clad layer 40' nearby and also includes a small-hill region 443 near a valley-like recessed region 203' with the short length over the previously placed second oxide mask led to a formation of the wider section 112' of the active layer due to higher growth rate of the p-type confinement/clad layer 40' nearby.

Eventually, as the p-region of the laser chip is formed after final growth of forming the p-region with a top surface, the ridge-like bump region 203 or the valley-like recessed region 203' is formed to be higher than surrounding shallow-bunker region 413 or lower than the surrounding small-hill region 443 to become a first alignment mark 203 or 203' on the top surface of the p-region, as seen in FIG. 1. Optionally, the first alignment mark 203 (203') carries a same lateral position relative to a projected line of the active region 101 on the top surface of the p-region as the previously placed second oxide mask 402 relative to the first oxide mask 401. As the oxide mask can be laid with sub-micron precision in its lateral position, the first alignment mark 203 (203') formed on the laser chip carries the same sub-micron precision that can be employed to achieve desired lateral alignment for the laser flip-chip bonding to the silicon photonics chip. Optionally, another first alignment mark with similar ridge/valley region can be formed symmetrically at an opposite side with equal spacing d relative to a project line of the active region at the top surface of the p-region.

FIGS. 5A through 5D are schematic diagrams showing a method of forming a lateral alignment mark for the laser chip according to an embodiment of the present invention. These diagrams are merely an example, which should not unduly limit the scope of the claims. One of ordinary skill in the art would recognize many variations, alternatives, and modifications. In a specific embodiment, the method includes a step of placing a first oxide mask 401 over the active layer 400 where the active region 101 (FIG. 1) is to be formed and a second oxide mask 402 of a second width w2 over the active layer 400 where an alignment mark is to be formed thereon. Optionally, an oxide layer is deposited overlying the active layer 400. A patterning/lithography process is executed to the oxide layer to define the first mask 401 with the first width w1 (and a first length extended in longitudinal y-direction from a front facet location to a rear facet location) and the second mask 402 with the second width w2 (and a second length about 1 µm or less in parallel to the first length). Optionally, the first width w1 and the second width w2 are configured to have a difference between 1 µm and 5 µm at their lateral positions with a separation of s in sub-micron precision. Optionally an oxide etching process is performed to lead the formation of the first oxide mask 401 and the second oxide mask 402 (see FIG. 5A).

Figure 5A:
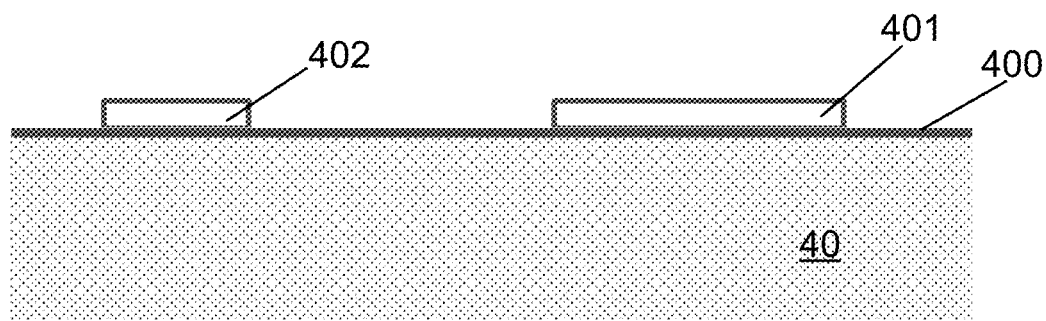
FIGS. 5A through 5D are schematic diagrams showing a method of forming a lateral alignment mark for the laser chip according to an embodiment of the present invention.
Figure 5B:
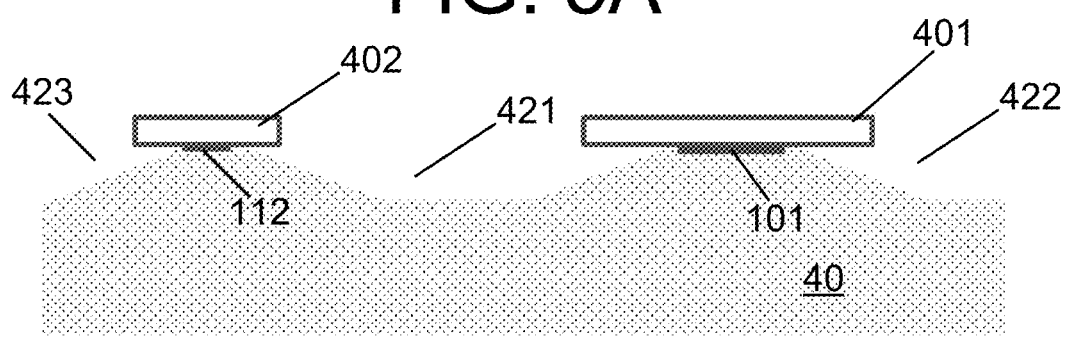
Figure 5C:
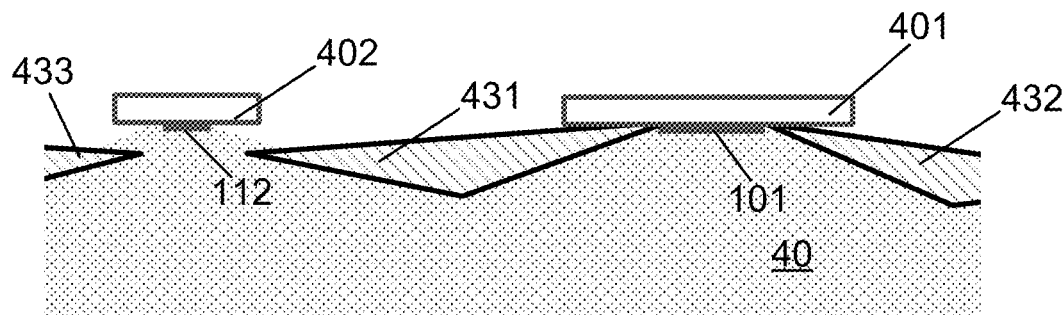
Figure 5D:
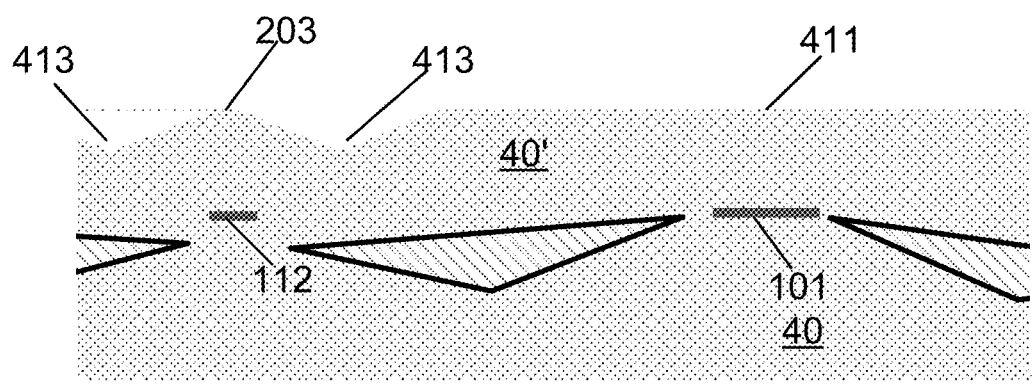

Further, the method includes a mesa etching to remove the active layer 400 that is not masked including extra portion of the n-type confinement/clad layer 40 below the active layer 400 with partially undercut the oxide masks to form the voids 421, 422, 423 around the oxide masks (see FIG. 5B). Additionally, the method includes, as shown in FIG. 5C, forming a current-blocking layer 431, 432, 433 in those voids 421, 422, 423. Optionally, the current-blocking layer 431, or 432, or 433 is a made of reverse-biased p-n junction layers (e.g., first a p-type InP layer then a n-type InP layer). Optionally, the current-blocking layer 431, or 432, or 433 can be a p-n-i-n structure or Fe-doped insulating material. The reverse-biased p-n junction will stop current flow from the side. Current only flow from the active area where there is no reverse-biased p-n junction. These current-blocking layers induce a regrowth enhancement effect to cause the growth rate around the oxide mask is different depending on the width of the oxide mask. Optionally, a higher regrowth rate is induced for region above the current-blocking layer than that that induced above the second current-blocking layer. Optionally, the method includes a step of removing the first oxide mask and the second oxide mask to leave the active region 101 with the first length and a narrower second section of the active layer 112 with the short second length.

Furthermore, the method includes a step of performing a regrowth process to add confinement/clad layer (in p-type) to the structure of FIG. 5C with the oxide masks being removed. The regrowth process includes using MOCVD to deposit p-type InP-based material to grow a p-region 40' of the laser chip with different growth rates for regions induced by the current-blocking layer around the active region 101 and around the narrower second section of the active layer 112. Optionally, the growth rate of InP-based material is lower around the narrower second section of the active layer 112 to create a shallow-bunker region 413 while resulting in a small hill region 203 right above the narrower second section of the active layer 112. The region above the active region 101 grows with relative uniform rate (higher than the shallow-bunker region 413) to achieve relatively flatten region 411. Moreover, the method includes a step performing final growth to finalize formation of the p-region 40' with a top surface having a relative flat region 411 to cover the active region 101 and a ridge-like region 203 with a short length in longitudinal direction over the narrower second section of the active layer 112. At the top surface of the p-region 40' the ridge-like region 203 becomes the first alignment mark. Optionally, another ridge-like region with similar structure can be formed on an opposite side by placing a third oxide mask at the opposite site with an equal lateral distance s relative to the first oxide mask. Thus, optionally, the first alignment mark formed on the laser chip can be a pair of alignment marks with a symmetric lateral location relative to the active region. Optionally, the lateral positions of these alignment marks can be determined with sub-micron precision at one side or symmetrically two sides of the active region of the laser chip. Optionally, these alignment marks can be formed at the top surface of either the p-region or the n-region, depending on manufacture process setup.

Optionally, the one or two first alignment marks formed in the laser chip as shown above can be used to align the laser for flip-chip bonding to a chip-site on the silicon photonics chip laterally with one or two corresponding second alignment marks formed on the (recessed) surface where the chip-site is designed (see FIG. 1). The second alignment marks on the (recessed surface) of the silicon photonics chip can be formed in many ways with sub-micron precision to meet the requirement for passive alignment between the active region and a waveguide port.

Figure 7:
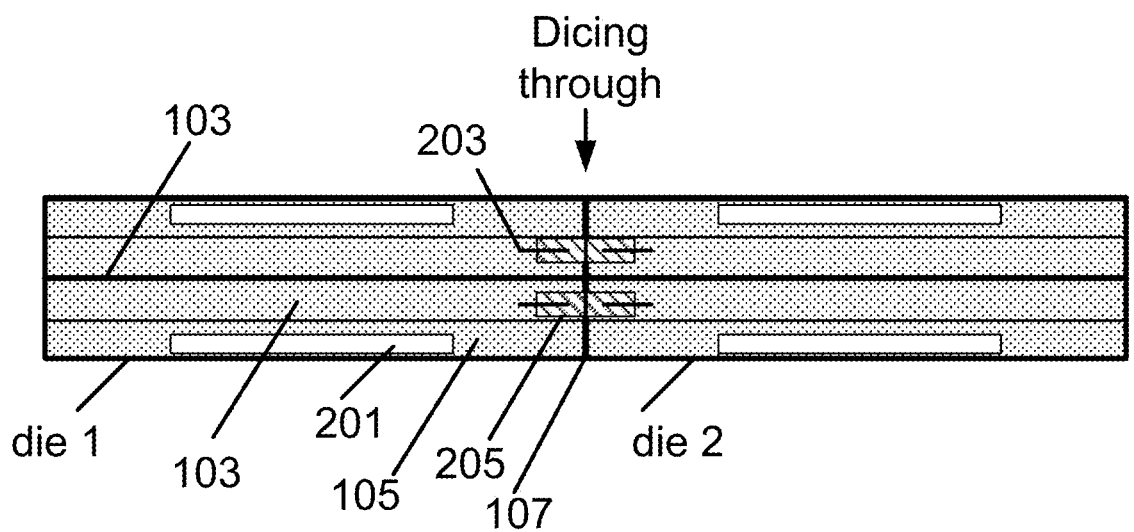
FIG. 7 is a schematic top-view diagram showing a method of forming a thin metal film for identifying a front facet of the laser chip according to an embodiment of the present invention.

In another embodiment, the laser chip is formed with another alignment feature configured to identify the front facet of the chip body so that the laser chip can be well positioned along the longitudinal direction (along the active region). FIG. 7 is a schematic top-view diagram showing a method of forming a thin metal film for identifying a front facet of the laser chip according to an embodiment of the present invention. This diagram is merely an example, which should not unduly limit the scope of the claims. One of ordinary skill in the art would recognize many variations, alternatives, and modifications. As shown, in the simplified diagram two neighboring chip dies are shown on a wafer for making laser chips. Referring to die 1, which is nearly finished in the fabrication process, the laser chip of die 1 includes all the features shown in FIG. 1, including a p-region 103, a n-region 105, an active region 101 buried between the p-region and the n-region, two vertical stoppers 201, a pair of first alignment marks 203 formed on top surface of the p-region 103. In addition, the laser chip of die 1 also includes a thin metal film 205 formed on the top surface of the p-region 103. Optionally, the thin metal film 205 can be formed in a same process for forming a p-metal with patterns on the top surface of the p-region 103, which is configured to form an electrical contact for the laser chip. In particular, the die 1 and die 2 are still in a singular body in the wafer. The thin metal film 205 is patterned and formed across a boundary line 107 perpendicular to the active region 101 between the die 1 and die 2 due the wafer processing. In the end of the wafer processing for forming the laser chips, a dicing process is executed to cut the wafer through the boundary line with the thin metal film covered to separate the die 1 from the die 2 for obtaining respective individual laser chips. The dicing process automatically create a cleaved edge of the thin metal film as well as a facet for each of the two laser chip bodies. Thus, a laser chip is obtained with a front facet 107 sharing the cleaved edge with the thin metal film 205, making the cleaved edge automatically to be an alignment feature for identifying the front facet 107 for optical alignment along longitudinal direction as the laser chip being flip-bonded to the silicon photonics chip.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A laser chip for flip-chip bonding to a silicon photonics chip comprising a waveguide, the laser chip comprising:
    an active region disposed in the laser chip along a plane parallel to the waveguide in the silicon photonics chip; and
    a first pair of stoppers formed on the laser chip to mate with a second pair of stoppers formed on the silicon photonics chip when the laser chip is bonded to a bonding site on the silicon photonics chip, the first and second pairs of stoppers extending along an axis perpendicular to the plane, at least one of the first pair of stoppers and the second pair of stoppers being configured to align the active region away from the waveguide towards the bonding site on the silicon photonics chip,
    wherein due to the alignment, the waveguide is at a first distance from the bonding site, the active region is at a second distance from the bonding site, the first and second distances being along the axis perpendicular to the plane parallel to the waveguide, the first distance being greater than the second distance.

2. The laser chip of claim 1 wherein the alignment of the active region relative to the waveguide along the axis is configured to limit an optical loss of optical coupling between the active region and the waveguide to less than or equal to 3 dB.

3. The laser chip of claim 1 further comprising a first pair of alignment marks disposed symmetrically on either side of the active region, the first pair of alignment marks being configured to align with a second pair of alignment marks on the bonding site on the silicon photonics chip to align the active region relative to the waveguide along the plane parallel to the waveguide.

4. The laser chip of claim 3 further comprising a metal film with an edge shared with an end of the active region facing the waveguide, the metal film indicating a position of the active region to align the active region relative to the waveguide along the plane parallel to the waveguide.

5. The laser chip of claim 1 further comprising a metal film with an edge shared with an end of the active region facing the waveguide, the metal film indicating a position of the active region to align the active region relative to the waveguide along the plane parallel to the waveguide.

6. The laser chip of claim 1 wherein the active region extends between a front facet and a rear facet that are disposed along the plane parallel to the waveguide with the front facet facing the waveguide, the active region being disposed between an n-type doped region and a p-type doped region with the p-type doped region being narrower than the n-type doped region and being bonded to the bonding site on the silicon photonics chip, and the first pair of stoppers extending from the n-type doped region parallel to the p-type doped region.

7. The laser chip of claim 6 further comprising a first pair of alignment marks disposed on a surface of the p-type doped region facing the bonding site on the silicon photonics chip, the first pair of alignment marks being configured to align with a second pair of alignment marks on the bonding site on the silicon photonics chip to align the active region relative to the waveguide along the plane parallel to the waveguide.

8. The laser chip of claim 7 further comprising a metal film with an edge shared with the front facet, the metal film indicating a position of the active region to align the active region relative to the waveguide along the plane parallel to the waveguide.

9. The laser chip of claim 6 further comprising a metal film with an edge shared with the front facet, the metal film indicating a position of the active region to align the active region relative to the waveguide along the plane parallel to the waveguide.

10. A laser chip for flip-chip bonding to a silicon photonics chip comprising a waveguide, the laser chip comprising:
an active region disposed in the laser chip along a plane parallel to the waveguide in the silicon photonics chip;
a first pair of stoppers formed on the laser chip to mate with a second pair of stoppers formed on the silicon photonics chip when the laser chip is bonded to a bonding site on the silicon photonics chip, the first and second pairs of stoppers extending along an axis perpendicular to the plane, at least one of the first pair of stoppers and the second pair of stoppers being configured to align the active region away from the waveguide towards the bonding site on the silicon photonics chip; and
a metal film with an edge shared with an end of the active region facing the waveguide, the metal film indicating a position of the active region to align the active region relative to the waveguide along the plane parallel to the waveguide.

11. A laser chip for flip-chip bonding to a silicon photonics chip comprising a waveguide, the laser chip comprising:
an active region disposed in the laser chip along a plane parallel to the waveguide in the silicon photonics chip;
a first pair of stoppers formed on the laser chip to mate with a second pair of stoppers formed on the silicon photonics chip when the laser chip is bonded to a bonding site on the silicon photonics chip, the first and second pairs of stoppers extending along an axis perpendicular to the plane, at least one of the first pair of stoppers and the second pair of stoppers being configured to align the active region away from the waveguide towards the bonding site on the silicon photonics chip;
a first pair of alignment marks disposed symmetrically on either side of the active region, the first pair of alignment marks being configured to align with a second pair of alignment marks on the bonding site on the silicon photonics chip to align the active region relative to the waveguide along the plane parallel to the waveguide; and
a metal film with an edge shared with an end of the active region facing the waveguide, the metal film indicating a position of the active region to align the active region relative to the waveguide along the plane parallel to the waveguide.

12. A laser chip for flip-chip bonding to a silicon photonics chip comprising a waveguide, the laser chip comprising:
an active region disposed in the laser chip along a plane parallel to the waveguide in the silicon photonics chip; and
a first pair of stoppers formed on the laser chip to mate with a second pair of stoppers formed on the silicon photonics chip when the laser chip is bonded to a bonding site on the silicon photonics chip, the first and second pairs of stoppers extending along an axis perpendicular to the plane, at least one of the first pair of stoppers and the second pair of stoppers being configured to align the active region away from the waveguide towards the bonding site on the silicon photonics chip; and
wherein the active region extends between a front facet and a rear facet that are disposed along the plane parallel to the waveguide with the front facet facing the waveguide, the active region being disposed between an n-type doped region and a p-type doped region with the p-type doped region being narrower than the n-type doped region and being bonded to the bonding site on the silicon photonics chip, and the first pair of stoppers extending from the n-type doped region parallel to the p-type doped region.

13. The laser chip of claim 12 further comprising a first pair of alignment marks disposed on a surface of the p-type doped region facing the bonding site on the silicon photonics chip, the first pair of alignment marks being configured to align with a second pair of alignment marks on the bonding site on the silicon photonics chip to align the active region relative to the waveguide along the plane parallel to the waveguide.

14. The laser chip of claim 13 further comprising a metal film with an edge shared with the front facet, the metal film indicating a position of the active region to align the active region relative to the waveguide along the plane parallel to the waveguide.

15. The laser chip of claim 12 further comprising a metal film with an edge shared with the front facet, the metal film indicating a position of the active region to align the active region relative to the waveguide along the plane parallel to the waveguide.

* * * * *